United States Patent
Li et al.

(10) Patent No.: US 10,541,133 B2
(45) Date of Patent: Jan. 21, 2020

(54) GAAS THIN FILM GROWN ON SI SUBSTRATE, AND PREPARATION METHOD FOR GAAS THIN FILM GROWN ON SI SUBSTRATE

(71) Applicant: SOUTH CHINA UNIVERSITY OF TECHNOLOGY, Guangzhou (CN)

(72) Inventors: Guoqiang Li, Guangzhou (CN); Fangliang Gao, Guangzhou (CN); Lei Wen, Guangzhou (CN); Shuguang Zhang, Guangzhou (CN); Jingling Li, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 207 days.

(21) Appl. No.: 15/563,599

(22) PCT Filed: Aug. 18, 2016

(86) PCT No.: PCT/CN2016/095921
§ 371 (c)(1),
(2) Date: Oct. 1, 2017

(87) PCT Pub. No.: WO2017/016527
PCT Pub. Date: Feb. 2, 2017

(65) Prior Publication Data
US 2018/0090316 A1 Mar. 29, 2018

(30) Foreign Application Priority Data

Jul. 30, 2015 (CN) .......................... 2015 1 0466401

(51) Int. Cl.
*C03B 25/10* (2006.01)
*H01L 21/02* (2006.01)
(Continued)

(52) U.S. Cl.
CPC ........ *H01L 21/02505* (2013.01); *C30B 25/10* (2013.01); *C30B 25/183* (2013.01);
(Continued)

(58) Field of Classification Search
CPC ........... H01L 21/02505; H01L 31/1852; H01L 21/3245; H01L 21/02694; H01L 21/02661;
(Continued)

(56) References Cited

U.S. PATENT DOCUMENTS

| | | | | |
|---|---|---|---|---|
| 5,959,308 A | * | 9/1999 | Shichijo | H01L 21/02381 257/18 |
| 9,870,918 B2 | * | 1/2018 | Li | H01L 31/03046 |
| 2010/0212729 A1 | * | 8/2010 | Hsu | H01L 21/02381 136/255 |

FOREIGN PATENT DOCUMENTS

| | | |
|---|---|---|
| CN | 103762256 | 4/2014 |
| CN | 105023962 | 11/2015 |

(Continued)

*Primary Examiner* — Jonathan C Langman
(74) *Attorney, Agent, or Firm* — JMB Davis Ben-David

(57) ABSTRACT

Disclosed is a preparation method for a GaAs thin film grown on an Si substrate, said method comprising the following steps: (1) Si (111) substrate cleaning; (2) Si (111) substrate preprocessing; (3) Si (111) substrate oxide film removal; (4) first $In_xGa_{1-x}As$ buffer layer growth; (5) first $In_xGa_{1-x}As$ buffer layer in situ annealing; (6) GaAs buffer layer growth; (7) GaAs buffer layer in situ annealing; (8) second $In_xGa_{1-x}As$ buffer layer growth; (9) second $In_xGa_{1-x}$ As buffer layer in situ annealing; (10) GaAs epitaxial thin film growth. Also disclosed is a GaAs thin film grown on an Si substrate. The GaAs thin film obtained by the present invention has a good crystal quality, an even surface, and a positive promotional significance with regard to the preparation of semiconductor devices, particularly in the field of solar cells.

4 Claims, 2 Drawing Sheets

(51) Int. Cl.
     *C30B 25/10*     (2006.01)
     *C30B 25/18*     (2006.01)
     *C30B 29/42*     (2006.01)
     *H01L 21/324*     (2006.01)
     *H01L 31/18*     (2006.01)

(52) U.S. Cl.
     CPC .......... *C30B 29/42* (2013.01); *H01L 21/0262* (2013.01); *H01L 21/02381* (2013.01); *H01L 21/02463* (2013.01); *H01L 21/02546* (2013.01); *H01L 21/02631* (2013.01); *H01L 21/02661* (2013.01); *H01L 21/02694* (2013.01); *H01L 21/3245* (2013.01); *H01L 31/1852* (2013.01)

(58) Field of Classification Search
     CPC ........... H01L 21/02631; H01L 21/0262; H01L 21/02546; H01L 21/02463; H01L 21/02381; H01L 21/02433; H01L 31/1864; H01L 31/184; H01L 31/0352; H01L 31/0304; C30B 29/42; C30B 25/183; C30B 25/10; Y02E 10/544
     See application file for complete search history.

(56) References Cited

FOREIGN PATENT DOCUMENTS

| | | |
|---|---|---|
| CN | 204834639 | 12/2015 |
| JP | H07240370 | 9/1995 |
| TW | 200504834 | 9/2004 |

\* cited by examiner

GAAS THIN FILM GROWN ON SI SUBSTRATE, AND PREPARATION METHOD FOR GAAS THIN FILM GROWN ON SI SUBSTRATE

CROSS-REFERENCE TO RELATED APPLICATIONS

This is the U.S. National Stage of International Application No. PCT/CN2016/095921 filed Aug. 18, 2016, which was published in Chinese under PCT Article 21(2), which in turn claims the benefit of China Patent Application No. 201510466401.0, filed Jul. 30, 2015.

FIELD OF THE INVENTION

The invention relates to a GaAs thin film grown on an Si substrate, and in particular to a GaAs thin film grown on an Si substrate and a preparation method therefore.

BACKGROUND OF THE INVENTION

Since Si has advantages of technical maturity, low costs, a high mechanical strength and being easily made in a large size, the III-V semiconductor materials grown extendedly on Si, especially GaAs, are very attractive. If the epitaxial growth of GaAs material with a high quality on Si was realized, the production cost of important semiconductor devices such as GaAs solar cells, optoelectronic detectors and so on, would be greatly reduced, and the combination of microelectronics and photoelectrons would also be realized, which have a broad application prospect. However, there exist some problems with the epitaxial GaAs thin films on the Si substrate. On the one hand, the lattice constant of Si is smaller than that of GaAs, and there are more than 4% lattice mismatches between them. This results in a large number of misfit dislocations in GaAs during the growth and deteriorates the device performances. On the other hand, defects of the surface properties of the Si substrate, such as twin crystals, and anti-phase domain, are likely to occur, especially when there are a large mismatches between the epitaxial material and the substrate. The formation of these defects causes the epitaxial film surface to form a large number of pyramid-shaped or flute-type protuberances, and seriously affects the surface flatness of GaAs semiconductor devices.

In order to suppress the effects of dislocation due to the lattice mismatch and twin crystals on the material properties, the most direct approach is to eliminate the stress between the epitaxial film and the substrate. The common method of eliminating the stress is to insert several graded components and thicker buffer layers between the substrate and the epitaxial film. However, the growing steps of this graded structure buffer layer are often cumbersome, and it is difficult to precisely control compositions, thicknesses, and crystal qualities of material of each layer, thus affecting the quality of the GaAs film finally obtained. Therefore, in order to obtain a GaAs film having a low defect density and a high quality, it is necessary to optimize the buffer layer growth process.

SUMMARY OF THE INVENTION

In order to overcome the above-mentioned drawbacks and shortcomings of the prior art, the present invention is to provide a GaAs thin film grown on Si substrate having a better crystal quality and a smooth surface.

Another object of the present invention is to provide a preparation method for a GaAs thin film grown on Si substrate.

The preparation method for a GaAs thin film grown on Si substrate comprises the following steps of:

(1) cleaning a Si substrate;

(2) preprocessing the Si substrate;

(3) removing the oxide film from the Si substrate;

(4) growing a first $In_xGa_{1-x}As$ buffer layer: decreasing temperature of the substrate to 350~500° C., and growing an $In_xGa_{1-x}As$ buffer layer with a thickness of 2~20 nm under the conditions of a reaction chamber pressure of $3.0\times10^{-5} \sim 2.5\times10^{-8}$ Pa, a V/III value of 20~30, and a growth rate of 0.1~0.5 ML/s, wherein $0.05 < x < 0.10$;

(5) in situ annealing the first $In_xGa_{1-x}As$ buffer layer: increasing the substrate temperature to 500~540° C. and annealing for 10~20 min, and the pressure of the reaction chamber being $3.0\times10{-5} \sim 2.5\times10{-8}$ Pa;

(6) growing a GaAs the buffer layer: decreasing the temperature of the substrate temperature to 350~500° C., and growing a GaAs buffer layer with a thickness of 2~20 nm under the conditions of a reaction chamber pressure of $3.0\times10^{-5} \sim 2.5\times10^{-8}$ Pa, a V/III value of 20~30, and a growth rate of 0.1~0.5 ML/s;

(7) in situ annealing the GaAs buffer layer: increasing the substrate temperature to 500~540° C. and annealing for 10~20 min, the pressure of the reaction chamber being $3.0\times10{-5} \sim 2.5\times10{-8}$ Pa;

(8) growing a second $In_xGa_{1-x}As$ buffer layer: decreasing the temperature of the substrate to 350~500° C. and growing a GaAs buffer layer with a thickness of 2~20 nm under the conditions of a reaction chamber pressure of $3.0\times10{-5} \sim 2.5\times 10{-8}$ Pa, a V/III value of 20~30, and a growth rate of 0.1~0.5 ML/s, wherein $0.01 < x < 0.05$;

(9) in situ annealing the second $In_xGa_{1-x}As$ buffer layer: increasing the temperature of the substrate to 500~540° C. for 10~20 min, the pressure of the reaction chamber being $3.0\times10{-5} \sim 2.5\times10{-8}$ Pa;

(10) growing a GaAs epitaxial film: increasing the substrate temperature to 500~580° C. and growing a GaAs epitaxial film with a thickness of 100 nm~1000 nm under the conditions of a reaction chamber vacuum degree of $4.0\times10^{-5} \sim 2.7\times10^{-8}$ Pa, a V/III value of 40~60, and a growth rate of 0.6~1 ML/s.

Said cleaning Si substrate in step (1) specifically refers to:

washing the substrate with acetone and deionized water to remove organic compounds on the substrate surface; placing the Si substrate in a solution in a ratio of $HF:H_2O=1:10$ for a ultrasound treatment for 1~10 minute; then washing the substrate with deionized water to remove surface oxide and organic compounds; and drying the cleaned substrate with high purity nitrogen.

Said preprocessing Si substrate in step (2) specifically refers to:

after cleaning the Si substrate, transferring the substrate into an injection chamber and pre-degassing it for 15~30 minutes; then transferring it to a transfer room and degassing for 0.5~2 hours at a temperature of 300~400° C.; and transferring the substrate into a growth chamber after the completion of degassing.

Said removing oxide film of the Si substrate specifically refers to:

after the Si substrate entering the growth chamber, increasing the temperature of the substrate to 950~1050° C. and baking the substrate at a high temperature for 45~60 minutes to remove the oxide film from the substrate surface.

A GaAs thin film grown on a Si substrate comprises a substrate of a multilayer stacked structure from bottom to top, a first InxGa1-xAs buffer layer, a GaAs buffer layer, a second InxGa1-xAs buffer layer, and a GaAs epitaxial film;

Said first InxGa1-xAs buffer layer is a first InxGa1-xAs buffer layer grown at 350~500° C. and annealed at 500~540° C., wherein 0.05<x<0.10;

Said GaAs buffer layer is a GaAs buffer layer grown at 350~500° C. and annealed at 500~540° C.;

Said second InxGa1-xAs buffer layer is an InxGa1-xAs buffer layer grown at 350~500° C. and annealed at 500~540° C., wherein 0.05<x<0.10;

The thickness of said first InxGa1-xAs buffer layer is 2~20 nm.

The thickness of said GaAs buffer layer is 2~20 nm.

The thickness of said second InxGa1-xAs buffer layer is 2~20 nm.

The thickness of said GaAs epitaxial film is 100 nm~1000 nm.

Compared with the prior art, the present invention has the following advantages and beneficial effects:

(1) By means of stress compensation buffer layer structure technology of the low temperature $In_xGa_{1-x}As$ (0.05<r<0.10) (0.05<x<0.10) buffer layer, the low temperature GaAs buffer layer and the low temperature $In_xGa_{1-x}As$ (0.01<x<0.05) buffer layer, each low temperature buffer layer is subject to in situ annealing after the end of the growth process, which can effectively change the reconstruction process of Group III atoms on the Si surface, inhibit the formation of twin crystals in GaAs films, and improve the flatness of the epitaxial film surface.

(2) The $In_xGa_{1-x}As$ (0.05<x<0.10)/GaAs/$In_xGa_{1-x}As$ (0.01<x<0.05) stress-compensated buffer layer structure used in the invention can effectively release the stress during the GaAs growth process, inhibit the formation of mismatch dislocation and improve the crystal quality of GaAs epitaxial films.

(3) The method of the invention is simple and convenient, and the obtained product has a simple buffer layer structure, a smooth surface of GaAs epitaxial film and a high crystal quality which is convenient for popularization and application.

DESCRIPTION OF EXAMPLE EXAMPLES OF THE INVENTION

Figure 1:
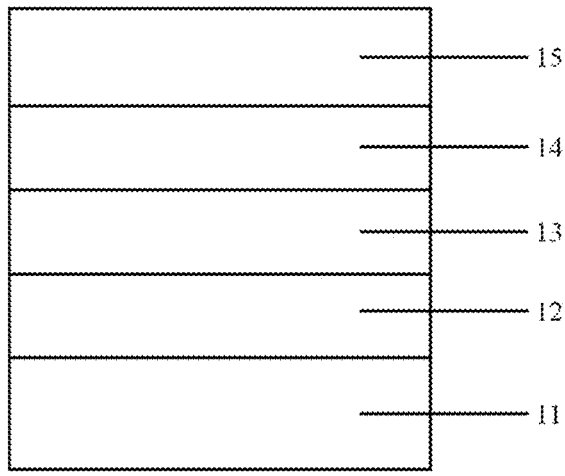
FIG. 1 is a schematic diagram of the structure of the GaAs thin film grown on Si substrate in an example of the present invention.

The present invention will be further described in detail below with reference to examples and figures; however, the examples of the present invention are not limited thereto.

Example 1

A preparation method for a GaAs thin film grown on a Si substrate in this example comprising the following steps:

(1) Cleaning a Si (111) substrate, specifically:

washing the substrate with the acetone and deionized water to remove organic compounds on the substrate surface; placing the Si substrate in a solution in a ratio of $HF:H_2O=1:10$ for a ultrasound treatment for 1 minute; then washing the substrate with deionized water to remove surface oxides and organic compounds; and drying the cleaned substrate with high purity nitrogen.

(2) Preprocessing the Si (111) substrate, specifically:

after cleaning the Si (111) substrate, transferring the substrate into an injection chamber and pre-degassing it for 15 minutes; then transferring it into a transfer room and degassing for 0.5 hours at a temperature of 300° C.; and transferring the substrate into a growth chamber after the completion of degassing.

3) Removing the oxide film from the Si (111) substrate, specifically:

after the Si (111) substrate enters the growth chamber, increasing the temperature of the substrate to 950° C. and baking the substrate at a high temperature for 45 minutes to remove the oxide film from the substrate surface.

(4) Growing a first $In_xGa_{1-x}As$ buffer layer:

decreasing the temperature of the substrate to 350° C., and growing an $In_xGa_{1-x}As$ buffer layer with a thickness of 2 nm under the conditions of a reaction chamber pressure of $3.0\times10^{-5}$ Pa, a V/III value of 20, and a growth rate of 0.1 ML/s, wherein x=0.05.

(5) In situ annealing the first $In_xGa_{1-x}As$ buffer layer:

increasing the temperature of the substrate to 500° C. for 10 min and the pressure of the reaction chamber being $3.0\times10^{-5}$ Pa.

(6) Growing a GaAs buffer layer:

decreasing the temperature of the substrate to 350° C., and growing a GaAs buffer layer with a thickness of 2 nm under the conditions of a reaction chamber pressure of $3.0\times10^{-5}$ Pa, a V/III value of 20, and a growth rate of 0.1 ML/s.

(7) In situ annealing the GaAs buffer layer;

increasing the substrate temperature to 500° C. for 10 min and the pressure of the reaction chamber being $3.0\times10^{-5}$ Pa.

(8) Growing a second $In_xGa_{1-x}As$ buffer layer:

decreasing the substrate temperature to 350° C. and growing an $In_xGa_{1-x}As$ buffer layer with a thickness of 2 nm under the conditions of a reaction chamber pressure of $3.0\times10^{-5}$ Pa, a V/III value of 20 and a growth rate of 0.1 ML/s; wherein x=0.01.

(9) In situ annealing the second $In_1Ga_{1-x}As$ buffer layer:

increasing the temperature of substrate to 500° C. and annealing for 10 min, the pressure of the reaction chamber being $3.0\times10^{-5}$ Pa.

(10) Growing the GaAs epitaxial film:

increasing the temperature of the substrate to 500° C., and growing a GaAs epitaxial film with a thickness of 100 nm under the conditions of a reaction chamber vacuum degree of $4.0\times10^{-5}$ Pa, a V/III value of 40, and a growth rate of 0.6 ML/s.

As shown in FIG. 1, a GaAs thin film grown on a Si substrate comprises a substrate of a multilayer stacked structure from bottom to top, a first $In_xGa_{1-x}As$ buffer layer (0.05<x<0.10) 12, a GaAs buffer layer 13, a second $In_xGa_{1-x}$As buffer layer (0.01<x<0.05) 14, and a GaAs epitaxial film 15.

Figure 2:
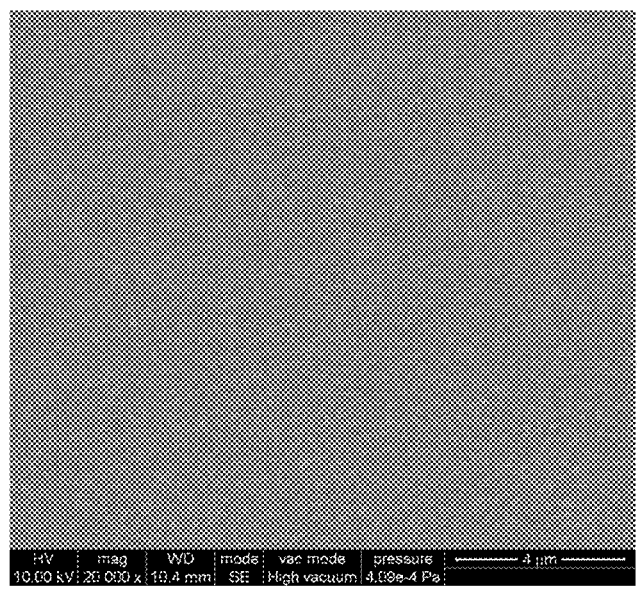
FIG. 2 is a scanning electron microscope (SEM) observation of surface morphology of the GaAs thin film grown on Si substrate in an example of the present invention.

FIG. 2 is a scanning electron microscope (SEM) observation of the surface morphology of the GaAs epitaxial film prepared by the present example, as can be seen there are no pyramid-shaped protrusions on the surface and the surface is very smooth. The GaAs epitaxial film grown by the present method has a higher crystal mass compared to the GaAs obtained by the conventional method, and the width of the half-peak of the X-ray rocking curve is 200 acrsec. Owing to the addition of buffer layer, it is almost impossible to observe pyramid-shaped protrusions caused by the twin crystals on the GaAs surface, and the surface is very smooth with a mean square surface roughness of 1.8 nm.

Figure 3:
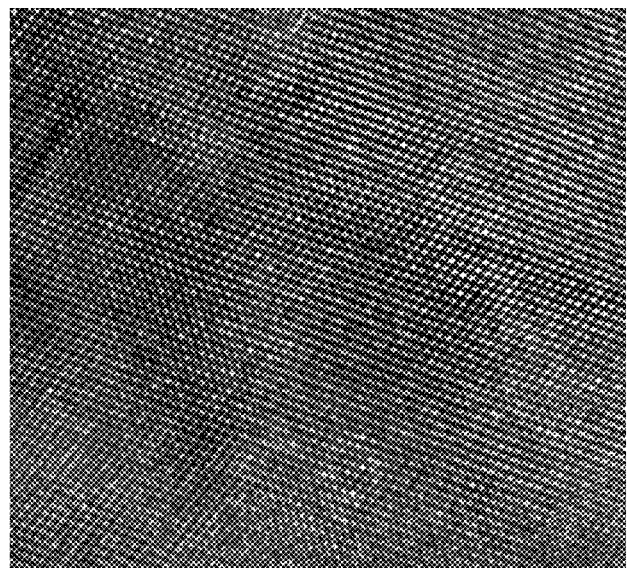
FIG. 3 is a transmission electron microscope (TEM) observation of surface morphology of the GaAs thin film grown on Si substrate in an example of the present invention.

FIG. 3 is a transmission electron microscope (TEM) observation of surface morphology of the GaAs epitaxial film prepared by the present example. No threading dislocations are observed in the figure which indicates the dislocation density is greatly reduced and the crystal quality is improved.

The first $In_xGa_{1-x}As$ (0.05<x<0.10) buffer layer, the GaAs buffer layer, the second $In_xGa_{1-x}As$ (0.05<x<0.10) buffer layer and the GaAs epitaxial layer of the GaAs thin film material structure in the present invention all can be prepared by molecular beam epitaxy growth or metal organic vapor deposition technique. The thicknesses of the first and second $In_xGa_{1-x}As$ buffer layer are controlled between 2~20 nm, the growth temperature is controlled between 300~450° C. and the V/III value is between 20~30, which reduces stresses due to the lattice mismatch by lowering the $In_xGa_{1-x}As$ buffer layers, to obtain GaAs thin films having a high crystal quality and smooth surface morphology.

Example 2

A preparation method for a GaAs thin film grown on a Si substrate in this example comprising the following steps:

(1) Cleaning a Si (111) substrate, specifically:
washing the substrate with acetone and the deionized water to remove the organic compounds on the substrate surface; placing the Si substrate in a solution in a ratio of $HF:H_2O=1:10$ for a ultrasound treatment for 10 minute; then washing the substrate with the deionized water to remove surface oxides and organic compounds; and drying the cleaned substrate with high purity nitrogen.

(2) Preprocessing the Si (111) substrate, specifically:
after cleaning the Si (111) substrate, transferring the substrate into an injection chamber and pre-degassing it for 30 minutes; then transferring it into a transfer room and degassing for 2 hours at a temperature of 400° C.; and transferring the substrate into a growth chamber after the completion of degassing.

3) Removing the oxide film of Si (111) substrate, specifically:
after the Si (111) substrate entering the growth chamber, increasing the temperature of the substrate to 1050° C. and baking the substrate at a high temperature for 60 minutes to remove the oxide film from the substrate surface.

(4) Growing a first $In_xGa_{1-x}As$ buffer layer:
decreasing the substrate temperature to 500° C., and growing an $In_xGa_{1-x}As$ buffer layer with a thickness of 20 nm under the conditions of a reaction chamber pressure of $2.5\times10^{-8}$ Pa, a V/III value of 30, and a growth rate of 0.5 ML/s, wherein x=0.10.

(5) In situ annealing the first $In_xGa_{1-x}As$ buffer layer:
increasing the substrate temperature to 500~540° C. for 20 min and the pressure of the reaction chamber being $2.5\times10^{-8}$ Pa.

(6) Growing a GaAs buffer layer:
decreasing the temperature of the substrate to 500° C., and growing a GaAs buffer layer with a thickness of 20 nm under the conditions of a reaction chamber pressure of $2.5\times10^{-8}$ Pa, a V/III value of 30, and a growth rate of 0.5 ML/s.

(7) In situ annealing the GaAs buffer layer;
increasing the substrate temperature to 540° C. for 20 min and the pressure of the reaction chamber being $2.5\times10^{-8}$ Pa.

(8) Growing a second $In_xGa_{1-x}As$ buffer layer:
decreasing the substrate temperature to 350~500° C. and growing an $In_xGa_{1-x}As$ buffer layer with a thickness of 20 nm under the conditions of a reaction chamber pressure of $2.5\times10^{-8}$ Pa, a V/III value of 30 and a growth rate of 0.5 ML/s; wherein x=0.05.

(9) In situ annealing the second $In_xGa_{1-x}As$ buffer layer:
increasing the substrate temperature to 540° C. and annealing for 20 min, the pressure of reaction chamber $2.5\times10^{-8}$ Pa.

(10) Growing the GaAs epitaxial film:
increasing the temperature of the substrate to 580° C., and growing a GaAs epitaxial film with a thickness of 1000 nm under the conditions of a reaction chamber vacuum degree of $2.5\times10^{-8}$ Pa, a V/III value of 60, and a growth rate of 1 ML/s.

The GaAs thin film grown on the Si substrate obtained in this example is similar to that of Example 1 and will not be described here.

The above examples are preferred examples of the present invention; however, the examples of the present invention are not limited to the above examples, and any other alteration, modification, substitution, combination and simplification made without departing from the spiritual essence and principle of the present invention are equivalent replacements and fall within the scope of protection of the present invention.

What is claim is:
1. A preparation method for a GaAs thin film grown on a Si substrate, characterized in that the method comprises the following steps:
(1) cleaning a Si substrate;
(2) preprocessing the Si substrate;
(3) removing the oxide film from the Si substrate;
(4) growing a first $In_xGa_{1-x}As$ buffer layer: decreasing the temperature of the substrate to 350~500° C., and growing an $In_xGa_{1-x}As$ buffer layer with a thickness of 2~20 nm under the conditions of a reaction chamber pressure of $3.0\times10^{-5}$~$2.5\times10^{-8}$ Pa, a V/III value of 20~30, and a growth rate of 0.1~0.5 ML/s, wherein 0.05<x<0.10;
(5) in situ annealing the first $In_xGa_{1-x}As$ buffer layer: increasing the substrate temperature to 500~540° C. and annealing for 10~20 min, and the pressure of the reaction chamber being $3.0\times10^{-5}$~$2.5\times10^{-8}$ Pa;
(6) growing a GaAs the buffer layer: decreasing the temperature of the substrate temperature to 350~500° C., and growing a GaAs buffer layer with a thickness of 2~20 nm under the conditions of a reaction chamber pressure of $3.0\times10^{-5}$~$2.5\times10^{-8}$ Pa, a V/III value of 20~30, and a growth rate of 0.1~0.5 ML/s;
(7) in situ annealing the GaAs buffer layer: increasing the substrate temperature to 500~540° C. and annealing for 10~20 min, the pressure of the reaction chamber being $3.0\times10^{-5}$~$2.5\times10^{-8}$ Pa;
(8) growing a second $In_xGa_{1-x}As$ buffer layer: decreasing the temperature of the substrate to 350~500° C. and growing a second $In_xGa_{1-x}As$ buffer layer with a thickness of 2~20 nm under the conditions of a reaction chamber pressure of $3.0\times10^{-5}$~$2.5\times10^{-8}$ Pa, a V/III value of 20~30, and a growth rate of 0.1~0.5 ML/s, wherein 0.01<x<0.05;
(9) in situ annealing the second $In_xGa_{1-x}As$ buffer layer: increasing the temperature of the substrate to 500~540°

C. for 10~20 min, the pressure of the reaction chamber being $3.0 \times 10^{-5}$~$2.5 \times 10^{-8}$ Pa;

(10) growing a GaAs epitaxial film: increasing the substrate temperature to 500~580° C. and growing a GaAs epitaxial film with a thickness of 100 nm~1000 nm under the conditions of a reaction chamber vacuum degree of $4.0 \times 10^{-5}$~$2.7 \times 10^{-8}$ Pa, a V/III value of 40~60, and a growth rate of 0.6~1 ML/s.

2. The preparation method for a GaAs thin film grown on a Si substrate according to claim 1, wherein said cleaning Si substrate in step (1) refers to:

washing the substrate with acetone and deionized water to remove organic compounds on the substrate surface; placing the Si substrate in a solution in a ratio of $HF:H_2O=1:10$ for a ultrasound treatment for 1~10 minute; then washing the substrate with deionized water to remove surface oxide and organic compounds; and drying the cleaned substrate with high purity nitrogen.

3. The preparation method for a GaAs thin film grown on a Si substrate according to claim 1, wherein said preprocessing Si substrate in step (2) refers to:

after cleaning the Si substrate, transferring the substrate into an injection chamber and pre-degassing it for 15~30 minutes; then transferring it to a transfer room and degassing for 0.5~2 hours at a temperature of 300~400° C.; and transferring the substrate into a growth chamber after the completion of degassing.

4. The preparation method for a GaAs thin film grown on a Si substrate according to claim 1, wherein said removing oxide film of the Si substrate refers to: after the Si substrate entering the growth chamber, increasing the temperature of the substrate to 950~1050° C. and baking the substrate at a high temperature for 45~60 minutes to remove the oxide film from the substrate surface.

* * * * *